United States Patent
Stanek et al.

(10) Patent No.: US 9,151,803 B2
(45) Date of Patent: Oct. 6, 2015

(54) PAIRING METHOD BASED ON ELECTRIC CURRENT SYNCHRONICITY FOR AUGMENTED BATTERIES

(71) Applicant: Panasonic Corporation, Osaka (JP)

(72) Inventors: Ganymed Stanek, Palo Alto, CA (US); Philippe Morin, Goleta, CA (US)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 483 days.

(21) Appl. No.: 13/690,422

(22) Filed: Nov. 30, 2012

(65) Prior Publication Data
US 2014/0152316 A1    Jun. 5, 2014

(51) Int. Cl.
*H02J 7/00*    (2006.01)
*G01R 31/36*    (2006.01)
*H01M 10/48*    (2006.01)
*H01M 10/42*    (2006.01)

(52) U.S. Cl.
CPC ....... *G01R 31/3606* (2013.01); *H01M 10/4257* (2013.01); *H01M 10/482* (2013.01); *H01M 2010/4278* (2013.01); *H01M 2220/30* (2013.01)

(58) Field of Classification Search
CPC .................................................. G01R 31/3606
USPC .......................... 320/106, 112; 324/126, 134
See application file for complete search history.

(56) References Cited

U.S. PATENT DOCUMENTS

| 8,618,775 | B2 * | 12/2013 | Hermann et al. | 320/136 |
| 8,847,775 | B2 * | 9/2014 | Morin et al. | 340/636.2 |
| 2011/0248668 | A1 | 10/2011 | Davis et al. | |
| 2012/0050153 | A1 | 3/2012 | Dvortsov et al. | |

* cited by examiner

*Primary Examiner* — Richard V Muralidar
(74) *Attorney, Agent, or Firm* — Harness, Dickey & Pierce, P.L.C.

(57) ABSTRACT

A plurality of augmented batteries each have internal communication circuitry and current monitoring circuitry allowing them to communicate current usage signatures with one another. Based on analysis of those respective signatures each augmented battery determines if it is "paired" with other batteries, by virtue of being installed in the same device. The augmented batteries use knowledge of pairing to control how they collectively behave to provide augmented functionality, such as alerting the user regarding the charge level within the batteries.

20 Claims, 5 Drawing Sheets

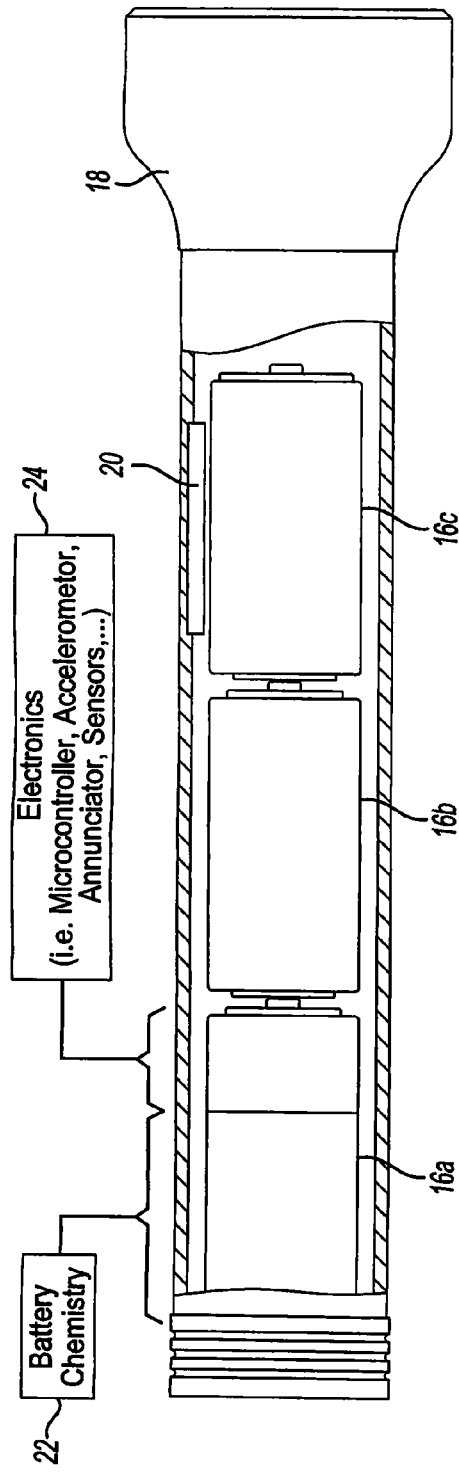
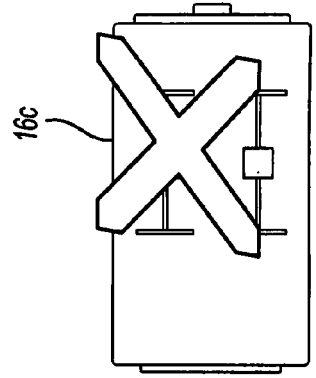
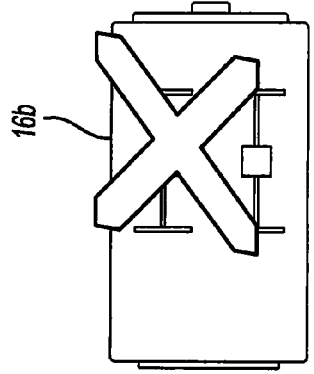
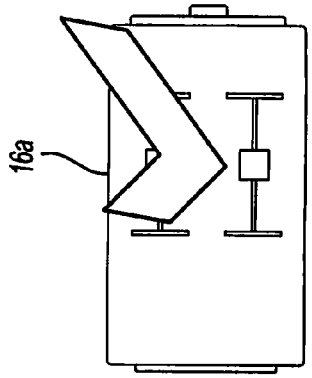
Fig-1
Fig-2

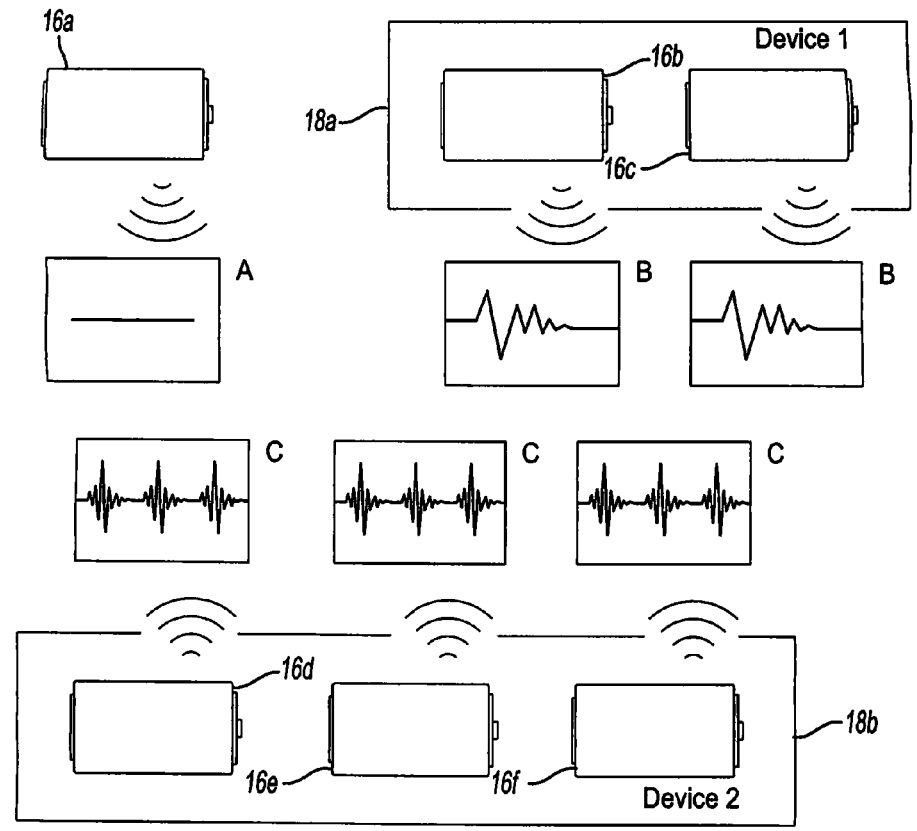
*Fig-3*
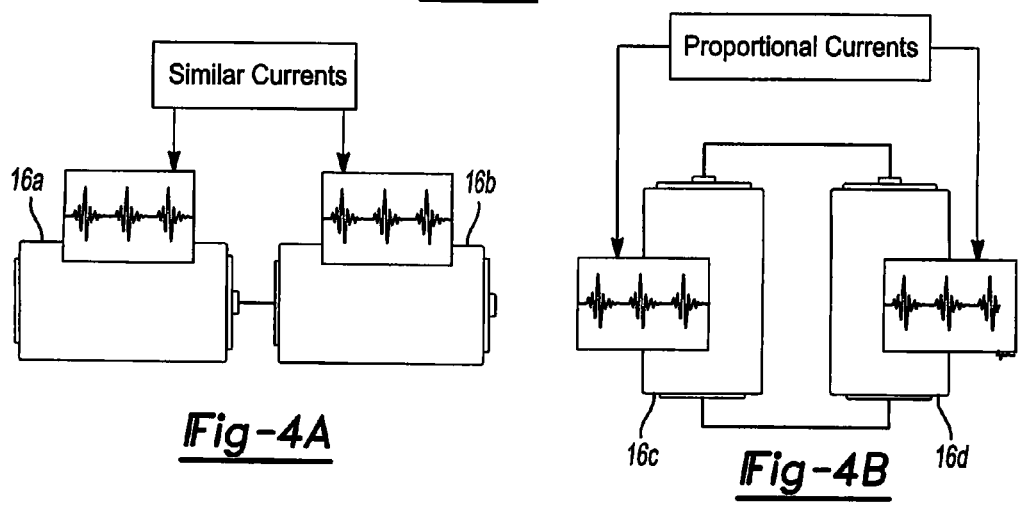
*Fig-4A*  *Fig-4B*

PAIRING METHOD BASED ON ELECTRIC CURRENT SYNCHRONICITY FOR AUGMENTED BATTERIES

FIELD

The present disclosure relates generally to electrochemical and other forms of storage batteries, such as supercapacitor storage devices. More particularly, the disclosure relates to batteries that have been augmented to include internal electronic components that add functionality, and to a system and method allowing such augmented batteries to determine if they may be paired into a collective or group associated with a common device.

BACKGROUND

This section provides background information related to the present disclosure which is not necessarily prior art.

Once a product is designed and sold, the hardware of that product can often no longer be updated because of lack of a standard electrical or mechanical interface for hardware enhancements. With some processor-implemented products it is sometimes possible to upload new software, to add new features or to correct deficiencies in the original model. While sometimes a useful technique, there are many products where such software upgrade is simply not possible.

SUMMARY

This section provides a general summary of the disclosure, and is not a comprehensive disclosure of its full scope or all of its features.

We have taken a fresh look at the problem of how to upgrade or enhance previously designed products and have conceived of an augmented battery that includes internal electrical components to provide augmented or enhanced product features, in an otherwise standard battery form factor. By way of example, the augmented battery can be equipped with an integrated audible warning system that reacts to the device being picked up and responds with an audible warning if the battery is low. Alternatively, the augmented battery might detect specific gestural motions (waving or tapping) and provide specific feedback to the user that communicate the charge status, with 1-5 beeps, depending on how full the battery is. In this context the augmented battery can be disposable or rechargeable. In this regard reference may be had to our co-pending U.S. patent application entitled "Tangible Charge Level Awareness Method and Apparatus Using Augmented Batteries," application Ser. No. 13/689,859, filed Nov. 30, 2012, the disclosure of which is hereby incorporated by reference.

One difficulty encountered when using augmented batteries is that the batteries will operate autonomously. Thus when a device contains more than one augmented battery, all batteries will provide augmented features, essentially concurrently and simultaneously. Thus in the previous example, all batteries would provide an audible warning as batteries becomes low, thus potentially producing multiple, redundant reports of the same low battery condition.

The present disclosure describes how to address this situation, by empowering each augmented battery in proximity to determine if it is disposed in the same device or otherwise "paired" so that all such batteries should respond as a group. By pairing augmented batteries into a common group, redundant reports can be eliminated and certain features can be disabled on a master-slave basis or otherwise, to save power and improve process efficiency.

In one aspect, the disclosed method determines when two or more batteries are installed in the same device. The method involves using a monitoring circuit within each of the two or more batteries to generate a current usage signature from each of the two or more batteries. Then the current usage signatures are compared for the respective two or more batteries and stored as a record in at least one electronic storage memory device that identifies batteries having correlated current usage signatures as being installed in the same device. These comparing and storing operations are performed by circuitry within the batteries themselves.

In another aspect, the disclosed method provides a way of paring a battery with an article (or another battery) characterized by a current usage signature. The method comprises the steps of: (1) employing a sensor disposed within the battery to generate a current usage signature for the battery; (2) employing a communication circuit disposed within the battery to receive the current usage signature from the article (or other battery); (3) employing a processor disposed within the battery to compare the battery current usage signature with the article current usage signature; and (4) based on the comparing step, the processor selectively storing pairing data in a memory disposed within the battery to indicate that the battery and the article are paired.

In yet another aspect, the disclosure describes an augmented battery comprising at least one electrochemical cell (or other charge storage cell such as a supercapacitor) disposed within the battery and capable of holding an electrical charge. An electrical condition monitor or charge monitor is disposed within the battery and electrically coupled to the cell. The electrical condition monitor or charge monitor is capable of detecting charge conditions within the cell and of generating an internal current usage signature. A processor is also disposed within the battery and coupled to said charge monitor. The processor has associated memory disposed within the battery. The augmented battery further includes a communication circuit disposed within the battery. The processor is programmed to receive an external current usage signature and to compare said external current usage signature with said internal current usage signature and to supply a report message to the communication circuit, reflecting whether the external current usage signature and said internal current usage signature are correlated.

In these ways, the augmented batteries are able to discover by communicating with one another if they are operably connected to the same device, based on current usage signatures. The augmented batteries can then change their functionality based on how they are so paired.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 1 is a cross-sectional view of an exemplary portable device (flashlight) into which multiple augmented batteries are installed;

FIG. 2 illustrates one exemplary use case where synchronicity among augmented batteries is beneficial;

FIG. 3 depicts different use case scenarios with current usage patterns A, B and C illustrating further aspects of the synchronicity among augmented batteries;

FIG. 4A depicts two synchronized augmented batteries connected in series; and FIG. 4B depicts two synchronized augmented batteries connected in parallel;

Corresponding reference numerals indicate corresponding parts throughout the several views of the drawings.

DETAILED DESCRIPTION

Figure 5:
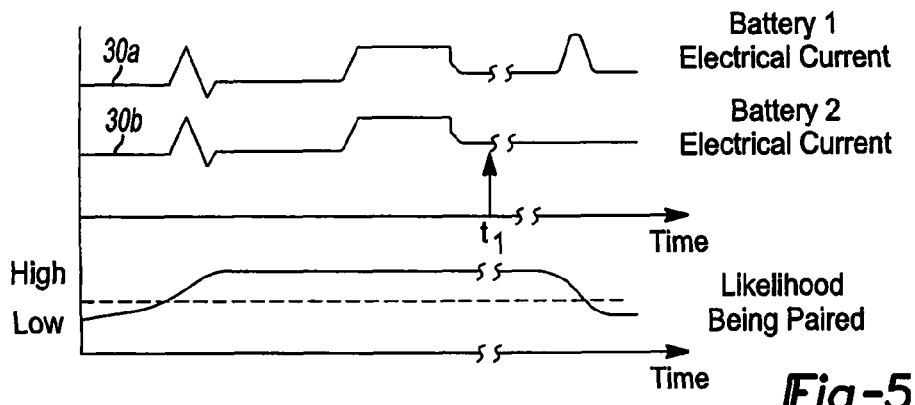
FIG. 5 depicts current usage signatures used in pairing synchronized augmented batteries.

Example embodiments will now be described more fully with reference to the accompanying drawings.

Referring to FIG. 1, three augmented batteries 16a, 16b and 16c are shown installed in an exemplary device 18 (flashlight). Although a flashlight has been illustrated here, it will be understood that the augmented batteries can be used in a wide variety of different devices ranging from digital cameras, mobile phones, portable computers, children's toys, and the like. The device 18 may or may not have its own sophisticated electronics functionality. To illustrate the concept, device 18 is shown to include an electronics package 20 that provides device functionality different from any functionality provided by the augmented batteries.

Each augmented battery comprises a charge storage battery component 22 (e.g., battery chemistry or capacitive storage) and an electronics component 24. The battery component 22 includes at least one electrochemical cell or other charge storage technology that is capable of storing an electric charge. A wide variety of different battery chemistry technologies or other charge storage technologies may be used for the augmented battery. The electronics component 24 comprises electronic circuitry responsible for providing augmented battery functionality. Such functionality may include, for example, monitoring the charge level within the battery and providing an annunciated message to the user when the user simply picks up the device intending to use it. Thus, the electronics package may include components such as a microcontroller, accelerometer or other motion sensor, an annunciator and other various sensors, depending on the augmented functions being provided. An exemplary circuit diagram will be discussed below in connection with FIG. 10.

When augmented batteries are installed in a device, unless some steps are taken to avoid this, each augmented battery provides augmented functionality. While this may be beneficial in some instances, there are other instances where it would be better if a single augmented battery could assume the role of master, allowing the other augmented batteries to serve as slave units or to have their augmented functionality switched off altogether. This is illustrated in FIG. 2 where augmented battery 16a is switched on for full augmented functionality, whereas the augmented functionality of batteries 16b and 16c are turned off. Although the augmented functionality is turned off on batteries 16b and 16c, these batteries nevertheless continue to supply electrical current so long as the batteries are connected together either in series or in parallel.

Thus, one objective of the presently disclosed technology is to allow augmented batteries to discover each other and determine when they should act in concert to provide augmented functionality. In this regard, the mere proximity of the augmented batteries to one another may not be sufficient to deem them "paired". For example, in a battery-powered clock radio, the product design may be such that one battery serves to power the clock device whereas another battery or set of batteries powers the radio and wakeup alarm functions. Thus, although multiple batteries would be installed in such clock radio, it cannot necessarily be inferred that all batteries should be paired together when providing augmented functionality. It might be desirable, for example, to provide one form of alert message when the clock battery is low, and a different alert message when the radio and alarm batteries are low.

As disclosed herein, the augmented batteries solve the pairing problem by monitoring charge levels or current usage within each battery cell to generate a current usage signature associated with each augmented battery. The batteries are further provided with a communication circuit whereby they can communicate their respective usage signatures to other batteries in proximity (i.e., augmented batteries able to communicate using their respective communication circuits). A processor or microcontroller associated with each augmented battery analyzes its current usage signature vis-à-vis other externally obtained current usage signatures to make a determination whether it should be paired with the other batteries supplying current usage signatures.

Figure 9:
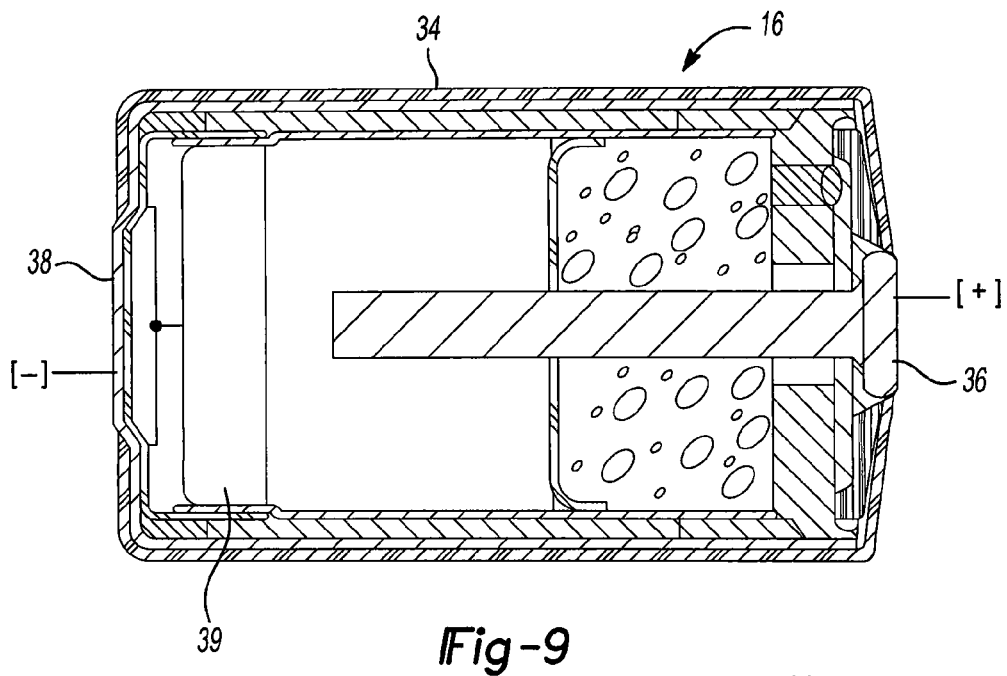
FIG. 9 is a cross-section of an exemplary augmented battery, showing placement of the augmented battery circuit components within the case of the battery.

While the form factor of the augmented battery, and the specific electrochemistry used, will vary depending on the application, FIG. 9 shows an exemplary augmented battery at 16. The battery includes a positive terminal [+] 36 and a negative terminal [−] 38 in the usual positions. Disposed within the can or case 34, the augmented battery includes a circuit package 39 that includes the components that support the augmented battery features and that implement the disclosed techniques for pairing. It will be appreciated that the circuit package can be deployed in a variety of different locations within the battery case, and that, if desired, the individual electronic components can be distributed in different places within the battery case.

Figure 10:
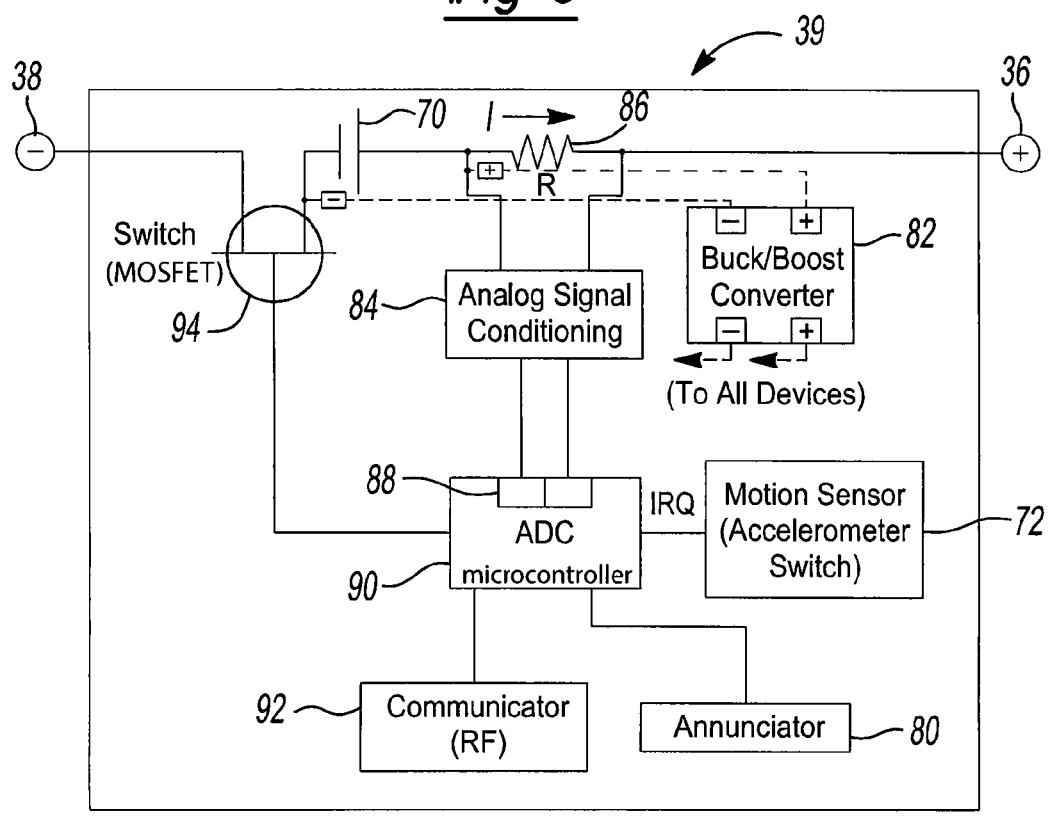
FIG. 10 is an electronic circuit diagram of an augmented battery configured to employ the disclosed techniques.

Referring to FIG. 10, the components of one exemplary circuit package 39 are illustrated. Other circuit configurations are possible. The embodiment of FIG. 10 uses a processor or microcontroller 90 that is programmed to perform the user alerting functions described herein. The same processor is also programmed to perform the pairing techniques discussed herein. Of course, the augmented battery can also be programmed and configured to perform other augmented functions as well.

As illustrated, the augmented battery includes a positive terminal 36 and a negative terminal 38 that are electrically coupled to the electrochemical cell 70, or other suitable charge storage device. The embodiment of FIG. 10 employs a collection of integrated components that are powered by the cell 70. Some of the components require specific voltages for proper operation. Thus the circuit includes a power conditioning circuit device in the form of a buck/boost converter 82. Buck/boost converter 82 draws power from the positive and negative terminals of cell 70, as depicted by dashed lines. The converter in turn provides regulated voltages to the various other components that make up the augmented battery circuit.

To simplify illustrating, the specific connections between the boost/buck converter 82 and the other operating components have not been illustrated.

In this embodiment, charge conditions within the cell are measured by monitoring voltage and current flow/that is sensed by monitoring across a reference resistor R shown at 86. By sensing in this fashion, the circuit is able to determine not only the instantaneous charge state of the cell 70 but also its power usage or current flow over time. In this regard, the current flow over time may be captured, stored and analyzed to learn more about the charge conditions within the cell. In the illustrated embodiment the current/is sensed using an analog signal conditioning circuit 84 that couples to an analog to digital convertor 88 input of microcontroller 90. Although a microcontroller with integral analog to digital convertor is presently preferred, a separate analog to digital circuit may also be used.

Coupled to microcontroller 90 is the motion sensor 72, annunciator 80 and a communicator circuit 92 that communicates wirelessly using radio frequency (RF). The communicator circuit 92 may include a wireless radio frequency transceiver with suitable antenna disposed within the battery in a location that is not blocked by the metal casing of the battery. One suitable position for the antenna is between the exterior of the battery casing and a plastic jacket that surrounds the metal casing. The motion sensor may comprise devices adapted to sense motion initiated by the user, including accelerometers, geolocation sensors (GPS), tilt switches, mercury switches and the like. The motion sensor serves as a convenient input by which the augmented battery deduces the intention of the user by analyzing the motion data.

Specifically, the microcontroller may be programmed to analyze the data from motion sensor 72 and to provide information to the user via the annunciator 80 and also via the communicator circuit 82, based on the type of motion sensed. Microcontroller 90 may be programmed to discriminate between shaking motions, tapping motions and the like, so that different types of user-supplied motions are interpreted in different ways, if desired. A shaking or waving motion is detected by analyzing the acceleration patterns. In this regard, sustained accelerations lasting more than a few tenths of seconds, or accelerations that cyclically change direction (as when shaking up and down or side to side) would signify user-intended motion; whereas, acceleration lasting less than a few tenths of seconds (as if the device is inadvertently nudged while resting on a table) would not be treated as signifying user-intended motion. More sophisticated logic may also be provided, if desired, to discriminate between the case where user motion is intended to elicit a response and the case where the user is simply walking with the battery operated device in his or her pocket. Such condition may be discriminated by measuring the patterns of detected bursts of motion. Short bursts of motion over a short interval would be interpreted as intended to elicit a response, whereas detected motion patterns over longer intervals would be interpreted as other human activity, such as walking, that are not tied to an expected response.

Tapping motion, such as the user tapping on the case of the device into which the augmented battery is installed, may also elicit user-intended motion response. Such tapping motion would be detected by microcontroller 90 when the motion sensor output supplies a sequence of short acceleration bursts (impulses) caused by repeated tapping. Such tapping motion is characterized not by long sustained motions in space but rather by a sequence of short jolts. If desired, the microcontroller may be programmed to count the number of taps received, so that the user can signify specific user-intended "requests" of the augmented battery by controlling the manner and number of taps supplied.

Inclusion of microcontroller 90 in the augmented battery also allows the augmented battery to perform other features not possible using conventional batteries. To illustrate this capability the circuit of FIG. 10 includes a switch 94, such as a MOSFET device that is connected in series with the negative terminal of the battery. In the alternative, a differently poled MOSFET may be used, coupled to the positive terminal. Microcontroller 90 can issue a signal to cause switch 94 to switch to an open circuit condition, thus disconnecting the augmented battery from the device into which it is installed. By controlling switch 94, the augmented battery can, for example, disconnect the battery from the device (to conserve power) until the device is lifted for use. Upon lifting, the motion sensor 72 would notify the microcontroller 90 which would, in turn, cause switch 94 to switch to a conducting state, allowing power to flow to the device, or for the purpose of turning on and off a device.

In general, microcontroller 90 can supply a wide variety of different functionality to the device into which the augmented battery has been installed. Using its ability to control supply of power to the device (as illustrated using switch 94) and also using the communicator 92, the augmented battery can add features to the device into which the battery is installed. By way of further illustration, detection of motion (or detection of arrival at a predetermined geolocation) could be used to produce an output of the annunciator, or to send a message to another device wirelessly using the communicator 92. For example, if the device into which the augmented battery is installed itself has wireless communication capability, the augmented battery could communicate directly with the device by communicating wirelessly over the same channel.

It should be appreciated that the ability to add features to a device by simply installing an augmented battery (designed to match the form factor of the conventional battery) is a powerful concept. In essence, any battery powered electrically or electronic device can be provided with augmented features, simply by exchanging an augmented battery for the conventional one. Moreover, such exchange of batteries does not preclude using a mixture of conventional and augmented batteries in the same device. A simple flashlight could be augmented by replacing only one of two conventional flashlight batteries with an augmented battery. Doing so would give the flashlight all of the augmented capabilities of the augmented battery, even though the other battery has no such capability.

It bears noting that the circuit package 39 and the circuit described in FIG. 10 is merely one embodiment providing augmented battery functions; other circuits for performing functionally equivalent operations or different augmented functions are envisioned. While a processor or microcontroller 90 has been illustrated in the circuit of FIG. 10, it will be understood that other embodiments may be implemented using application specific integrated circuit (ASIC) technology, which is considered an advantageous option for mass produced augmented battery devices.

Current Usage Signatures

FIG. 3 shows a group of batteries that will be presumed for this discussion to be in communication with one another through their respective communication circuits. Each of the augmented batteries in FIG. 3 monitors its current usage conditions and generates a current usage signature, shown by waveforms at A, B and C. Note that the waveform of A indicates that the battery 16*a* is not supplying any current, thus suggesting that battery 16*a* is not installed in any device, or is depleted; or that the device in which the battery is installed is completely turned off. Meanwhile, batteries 16b and 16c both exhibit current usage signatures shown at B that happen to match each other very closely. The matching of signatures is no coincidence because batteries 16b and 16c are installed in device 18a. Because both batteries are supplying current to the same device, their respective current usage signatures are expected to be the same (or at least correlated, as will be discussed more fully in connection with FIG. 4).

Similarly, augmented batteries 16d, 16e and 16f all exhibit current usage signatures shown at C. Again, the signatures substantially correlate to one another, thus suggesting that these batteries may be deemed or treated "paired" into a common group that behaves as a collective unit. Simply stated, these batteries exhibit the same current usage signature because they are installed in a common device 18b and thus experience the same operating conditions.

Note that the batteries 16b and 16c, while correlated with each other, are not correlated with batteries 16d, 16e or 16f. Although these respective batteries may be in communication with one another, by virtue of their respective communication circuits, the current usage signatures of the batteries installed in device 18a are different from the signatures of batteries installed in device 18b. Thus, the batteries in device 18a would not be paired with the batteries in device 18b.

The battery pairing technique disclosed here is applicable for both series and parallel connected batteries. This is shown in FIGS. 4A and 4B. The batteries 16a and 16b are connected in series in FIG. 4A, whereas batteries 16c and 16d are connected in parallel in FIG. 4B. When connected in series, the current flowing in both batteries is substantially the same or at least similar. When connected in parallel, the current signatures are proportional; that is, the respective currents rise and fall at the same times, although the peak values may differ. In either series or parallel case, the current usage signatures are correlated and thus serve as an indication that the respective batteries may be paired when considering augmented features.

In the simple case, the current usage signature will rise when the device is switched on and fall when the device is switched off. Thus, even without taking into account any minute fluctuations of current during use, correlation among batteries can be determined based on the times at which current flow is switched on and off—essentially representing the current usage signature as a one-bit (on-off) digital value. However, if desired, additional bits of resolution may be captured to thus represent the current usage signature as a current flow waveform with respect to time. This is illustrated in FIG. 5.

At the core of the augmented battery synchronization strategy, each augmented battery needs to measure its current usage and share that information with other augmented batteries in range of the communication circuit, to determine which batteries are installed in the same device. Depending on the implementation, either the entire continuous measurement of current consumption is shared among the augmented batteries; or alternatively, only uniquely identifying key segments, or even only key events, are shared. For instance, to reduce transmission and calculation overhead, in its simplest form, each battery determines the times it was turned on and off and shares only that information with the other batteries. Such implementation may be viewed as a current usage signature represented by a one bit (on/off) digital value.

Initially, the augmented batteries do not know whether they are installed in the same device as other batteries, or not. However, as they communicate with one another, over time, the augmented batteries acquire more correlating features in the current usage signature. Generally, the longer the time span over which current usage signatures are compared, the more reliable the correlation becomes.

When a battery is removed from a device and is replaced by another battery, the current usage signature of the removed battery will immediately start to deviate from the other batteries in the paired group. This will result in the removed battery showing a decreased likelihood that it is a part of the paired group, eventually resulting in a mutually shared decision that the removed battery should be disjoined from the group. Such decision to disjoin is made after the correlation value drops below a predetermined threshold.

In FIG. 5, the current usage signatures 30a and 30b are time-aligned for comparison. At time $t_1$, the battery with signature 30b is removed from the device, thus its current usage signature drops to zero thereafter. Plotted on the same axis below the current usage signatures is a correlation value representing the likelihood that these two batteries are paired. Note that the likelihood value rises as time proceeds up until time $t_1$. After $t_1$, the correlation between the two current usage signatures drops and thus eventually the likelihood falls below a predetermined level designated at "low".

Similarly, a newly-installed battery will start out with little correlation to the other installed batteries. However, eventually, the correlation value will rise above the low threshold and the newly-installed battery can be deemed to have joined the group. This occurs without any interaction on the user's part, apart from physically removing the old battery and installing the new one.

During the pairing process, once the batteries become paired, additional batteries can join the group even though those additional batteries may not necessarily be in close enough proximity to communicate with each of the other batteries in the group. All that is necessary is that the additional battery be capable of communicating with at least one of the paired batteries. In other words, once a paired group is formed, that group can negotiate with other augmented batteries on a collective basis. This allows redundant hardware among batteries within the paired group to be turned off, to save energy and to solve other technical problems caused when multiple batteries are each trying to communicate with an external device or with the user.

Having formed a group of paired augmented batteries, the group can function as a collective, periodically reevaluating the pairing status, as required. How often to reevaluate pairing status represents a tradeoff between the time required to detect changes in current usage signatures and the energy spent in measuring and communicating the current usage signatures with other augmented batteries.

Figure 6:
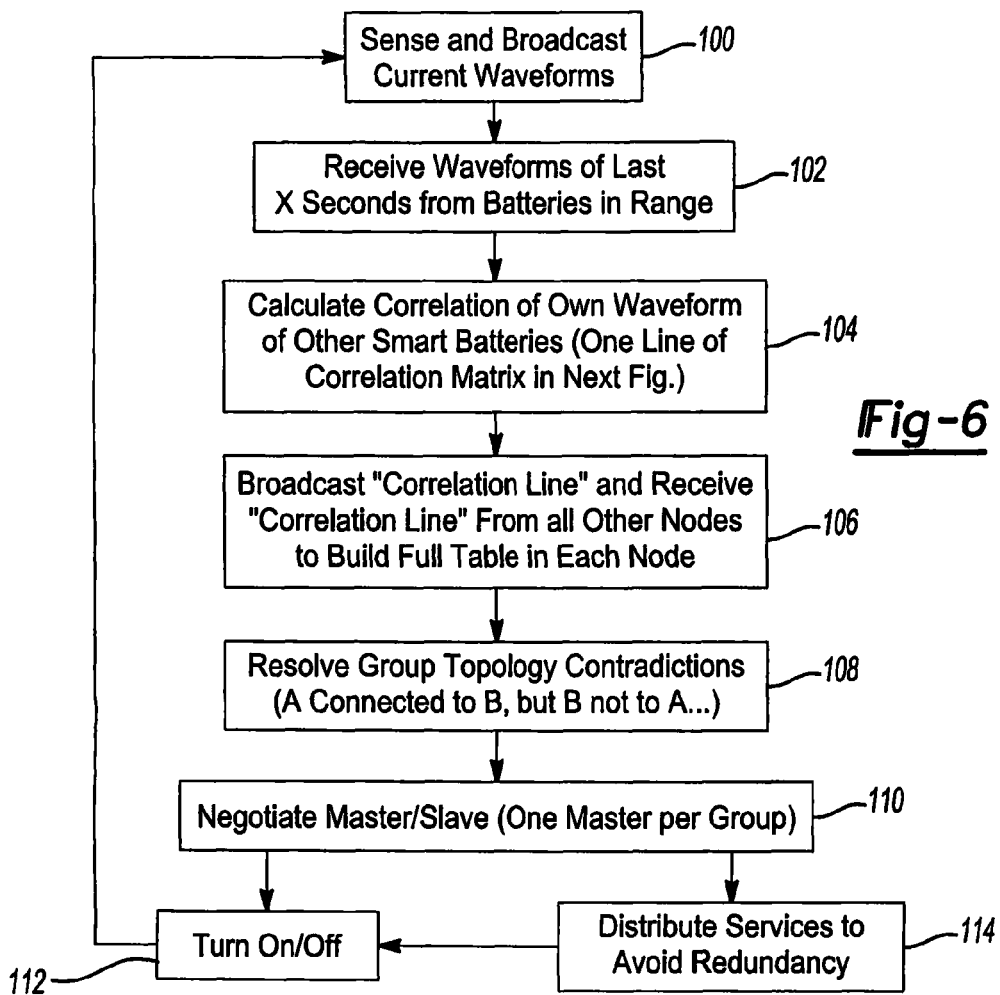
FIG. 6 is a flow chart diagram illustrating one embodiment of the synchronized augmented battery concept in use.

The preferred embodiment uses a microprocessor or microcontroller to manage communication with other augmented batteries and to make the pairing assessment. Alternatively, these functions may be implemented using an application specific integrated circuit (ASIC). FIG. 6 shows how the microcontroller is programmed to perform the pairing function. Unless a decision is made to abstain from performing these steps, generally each augmented battery performs the steps shown in FIG. 6.

The process begins at step 100 by sensing the current flow of the battery and broadcasting data indicative of this current flow vis-à-vis the communication circuit. As noted above, the resolution to which current sensing is performed may depend on the application. In a low-cost implementation, a single bit of data (on-off) may be sufficient to represent the instantaneous state of battery current flow. If current is flowing, the bit is set to '1' and if current is not flowing, the bit is set to '0'. If more resolution is required, the current flow can be sampled at higher bit depth (e.g., 8 bit, 16 bit, etc.), with the sampled data representing the current waveform or current usage signature.

Figure 7:
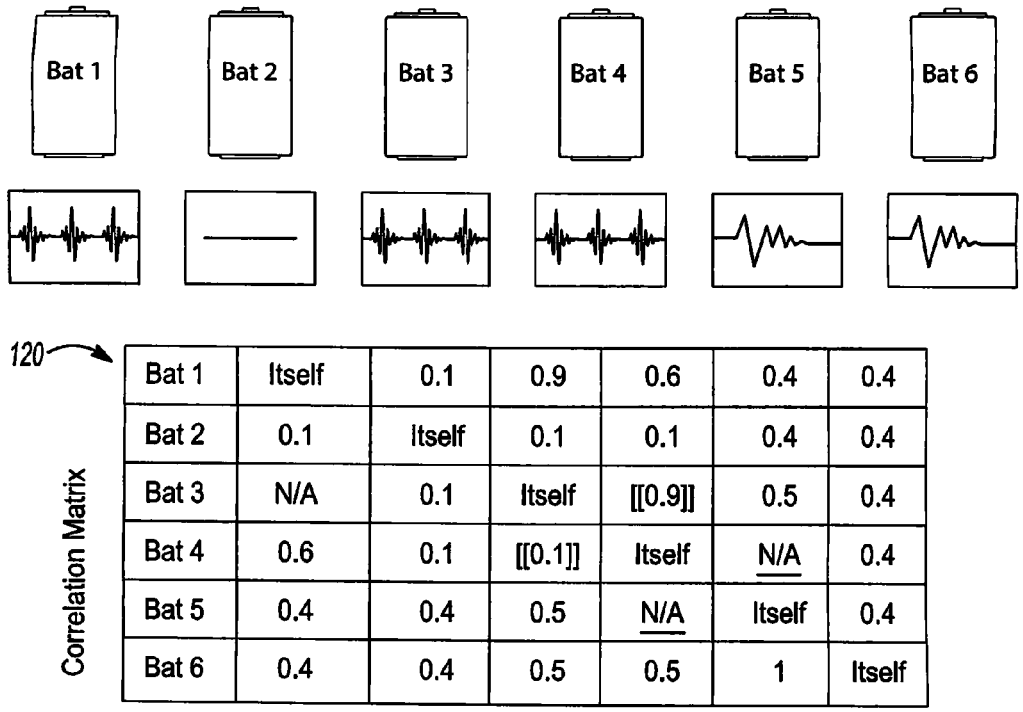
FIG. 7 is a correlation matrix further demonstrating the synchronization concept.

Next, at step 102, the microcontroller receives current waveforms covering the last predetermined number of seconds (x seconds) from all augmented batteries that are within range. The microcontroller reads the incoming current usage signatures using the communication circuit disposed within the battery. The microcontroller or processor then calculates a correlation between its own current usage signature (current waveform) and the other externally received signatures or waveforms. The calculated correlations may be stored in a correlation matrix 120 (shown in FIG. 7). The correlation matrix stores a unique identifier for each battery and a list of correlation values representing how closely that battery matches the others. The correlation matrix is preferably stored in a memory circuit associated with the microcontroller and thus disposed within the battery itself. The correlation matrix is configured using a data structure that can be expanded to include all augmented batteries that are within communication range of the current battery. In FIG. 7, the matrix stores six batteries, by way of example. In the correlation matrix 120 of FIG. 7, aggregated correlations are expressed between the current battery (Bat 1) and the other batteries within communication range. The other batteries would have their own correlation matrices, where each battery treats itself as the current battery and generates a "correlation line" of data showing how that battery correlates to each of the others. It could be that not every battery has the full correlation matrix, but only part of it. That is, the battery's correlation to other batteries may not reflect all other batteries in the full matrix. While the correlation matrix technique illustrated in FIG. 7 provides one way of sharing and assessing current signature information among batteries, other data structures are also possible.

Internally Stored Correlation Matrix

As shown at step 106 (FIG. 6), each microcontroller communicates its "correlation line" of the correlation matrix 120 with all of the other augmented batteries participating in the communication. When a microcontroller receives a correlation line from its counterpart in another augmented battery, it adds it to the correlation matrix. Thus, eventually, all communicating augmented batteries contribute their respective observations into the full correlation matrix. Thus, all augmented batteries share the same correlation matrix. Because the upper right half the matrix expresses the same correlations as the bottom left half, missing values can be deduced. In the exemplary matrix of FIG. 7, deduced values are shown as being underlined. Also, certain conflicts can be resolved. Thus, if battery 3 (Bat 3) thinks it is paired with Bat 4, but Bat 4 does not think it is paired with Bat 3, then the fact that both Bat 3 and Bat 4 are paired with Bat 1 can be used to resolve the conflict. Examples of such conflicts are shown in FIG. 7 using double brackets. Thus, at step 108 (FIG. 6), the augmented batteries resolve group topology contradictions and share the results with each other.

Master-Slave Negotiation

Next, at step 110, depending on the implementation, the augmented batteries can negotiate master/slave roles. For example, each group of paired augmented batteries may designate one master per group with the remaining being designated as slave. Depending on the implementation, the slave batteries can have their augmented battery features turned off as shown at 112, thus allowing the group to rely on the master to distribute services as at 114. By distributing services in this fashion, redundancy is avoided and battery power is conserved.

Figure 8:
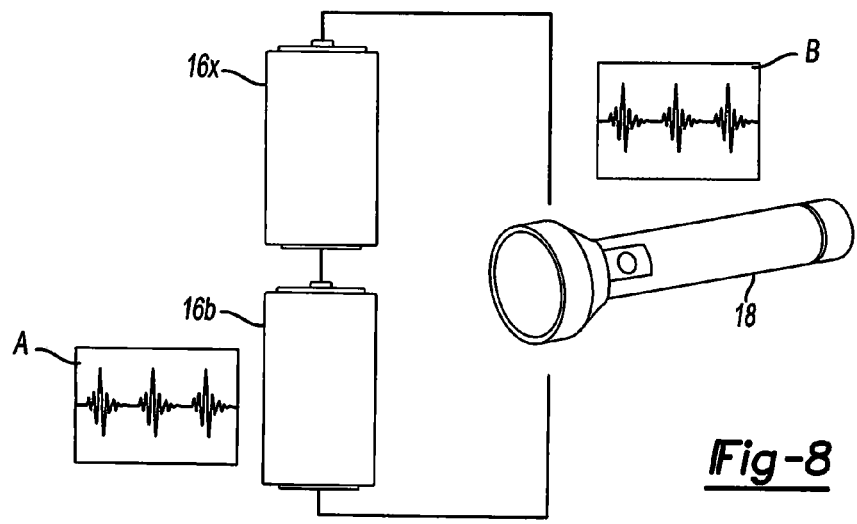
FIG. 8 illustrates an alternate embodiment where an augmented battery pairs with an external electrical device (e.g., flashlight)

In the discussion so far it has been assumed that current usage signatures are provided by the augmented batteries themselves, and thus pairing is based on finding correlation of battery current usage signatures among the augmented batteries. A possible variation of this scheme, illustrated in FIG. 8, treats the electrical device, such as device 18, as an entity in the pairing negotiation. In other words, pairing by comparison of current usage signatures is not limited to pairing augmented batteries with other augmented batteries. Augmented batteries can be paired with any electrical device capable of measuring and broadcasting its current usage. This enables matching a group of augmented batteries installed in a device with the device itself. This can be helpful if the device wants to communicate with the augmented batteries that are installed inside the device. Thus, in FIG. 8, the electrical device 18 has a current usage signature B that is correlated with the current usage signature A of augmented battery 16*a*. In this example, the second battery 16*x* installed in device 18 need not be an augmented battery.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A method of paring a battery with an article characterized by a current usage signature, comprising the steps of:
   employing a sensor disposed within the battery to generate a current usage signature for the battery;
   employing a communication circuit disposed within the battery to receive said current usage signature from the article;
   employing a processor disposed within the battery to compare the battery current usage signature with the article current usage signature; and
   based on said comparing step, the processor selectively storing pairing data in a memory disposed within the battery to indicate that the battery and the article are paired.

2. The method of claim 1 wherein the article is a second battery.

3. The method of claim 1 wherein the article is a second battery that employs a second sensor disposed within the second battery to generate a second current usage signature.

4. The method of claim 3 wherein the article is a second battery that employs a second communication circuit disposed within the second battery to transmit the second current usage signature to the communication circuit of said battery.

5. The method of claim 1 wherein the article is a second battery that employs a second processor disposed within the second battery, the processor disposed within said battery and the second processor disposed within said second battery negotiating with each other through the communication circuit to place one of said batteries in a master role and to place the other of said batteries in a slave role.

6. The method of claim 1 wherein said communication circuit includes a wireless transceiver disposed within the battery and wherein the current usage signature is broadcast wirelessly using said transceiver.

7. The method of claim 1 wherein said current signature is generated by periodically sampling the current flow from said battery and storing the sampled current flow as digital data values in a memory disposed within the battery.

8. The method of claim 7 further comprising using the processor to convert the stored digital data values into a parametric representation that serves as said current usage signature.

9. The method of claim 1 further comprising providing to the user of a device into which the battery is installed an augmented service using components disposed within the battery, and using said pairing data to selectively alter the providing of said augmented service.

10. The method of claim 9 wherein said pairing data is used to selectively deactivate the augmented service.

11. The method of claim 1 wherein the article is a second battery and wherein the battery and the second battery each have components that provide an augmented service extending the functionality of a device into which the batteries are installed and wherein the battery and the second battery each independently store paring data to indicate whether the battery and the second battery are paired.

12. The method of claim 1 wherein the article is a second battery and wherein the battery and the second battery each have components capable of providing an augmented service extending the functionality of a device into which the batteries are installed and wherein the battery and the second battery communicate with each other to negotiate which of the battery and the second battery shall provide the augmented service.

13. A method of determining when two or more batteries are installed in the same device, comprising:
using a monitoring circuit within each of said two or more batteries to generate a current usage signature from each of said two or more batteries; and
comparing the current usage signatures of the respective two or more batteries and storing a record in at least one electronic storage memory device that identifies batteries having correlated current usage signatures as being installed in the same device.

14. An augmented battery comprising:
at least one electrochemical cell disposed within the battery and capable of holding an electrical charge;
an electrical condition monitor disposed within the battery, electrically coupled to said cell, and capable of detecting charge conditions within the cell and for generating an internal current usage signature;
a processor disposed within the battery and coupled to said charge monitor, the processor having associated memory disposed within the battery; and
a communication circuit disposed within the battery,
the processor being programmed to receive an external current usage signature and to compare said external current usage signature with said internal current usage signature and supplying a report message to said communication circuit reflecting whether the external current usage signature and said internal current usage signature are correlated.

15. The augmented battery of claim 14 wherein said electrical condition monitor comprises an internal resistance within the battery across which the voltage drop is monitored and supplied to the processor as a data value as a function of time.

16. The augmented battery of claim 15 further comprising an analog to digital convertor that produces said data value.

17. The augmented battery of claim 15 wherein said analog to digital convertor produces a 1-bit data value reflecting the on-off state of current flow within the battery as a function of time.

18. The augmented battery of claim 14 further comprising a motion sensor coupled to said processor and disposed within the battery to detect user interaction with a device into which the augmented battery is installed.

19. The augmented battery of claim 14 further comprising an annunciator coupled to said processor and disposed within the battery to provide an alert to the user of a device into which the augmented battery is installed based on analysis of conditions within the battery performed by said processor.

20. The augmented battery of claim 14 wherein said communication circuit includes a wireless radio frequency transceiver.

* * * * *